(12) United States Patent
Lu et al.

(10) Patent No.: US 9,978,791 B2
(45) Date of Patent: May 22, 2018

(54) IMAGE SENSOR AND METHOD FOR MANUFACTURING THE SAME

(71) Applicant: TAIWAN SEMICONDUCTOR MANUFACTURING CO., LTD, Hsin-Chu (TW)

(72) Inventors: Tse-Hua Lu, Zhubei (TW); Ching-Chun Wang, Tainan (TW); Jhy-Jyi Sze, Hsinchu (TW); Ping-Fang Hung, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days. days.

(21) Appl. No.: 14/815,366

(22) Filed: Jul. 31, 2015

(65) Prior Publication Data
US 2017/0033139 A1 Feb. 2, 2017

(51) Int. Cl.
*H01L 27/146* (2006.01)

(52) U.S. Cl.
CPC .... *H01L 27/14621* (2013.01); *H01L 27/1469* (2013.01); *H01L 27/14634* (2013.01); *H01L 27/14685* (2013.01); *H01L 27/14664* (2013.01); *H01L 27/14627* (2013.01); *H01L 27/14636* (2013.01)

(58) Field of Classification Search
None
See application file for complete search history.

(56) References Cited

U.S. PATENT DOCUMENTS

| | | | |
|---|---|---|---|
| 2006/0290001 A1* | 12/2006 | Sulfridge | H01L 21/76898 257/774 |
| 2010/0090304 A1 | 4/2010 | Liu et al. | |
| 2012/0267690 A1* | 10/2012 | Endo | H01L 27/14632 257/225 |
| 2013/0277785 A1 | 10/2013 | Chen et al. | |
| 2013/0277789 A1 | 10/2013 | Chen et al. | |
| 2013/0284885 A1 | 10/2013 | Chen et al. | |
| 2014/0027872 A1 | 1/2014 | Yu et al. | |
| 2014/0042299 A1 | 2/2014 | Wan et al. | |
| 2015/0054962 A1* | 2/2015 | Borthakur | H04N 5/332 348/164 |
| 2016/0181215 A1* | 6/2016 | Sullivan | H01L 23/49827 257/737 |
| 2017/0221956 A1* | 8/2017 | Tsukimura | H01L 27/14647 257/443 |

FOREIGN PATENT DOCUMENTS

| | | |
|---|---|---|
| TW | 201133809 A1 | 10/2011 |
| TW | 201241999 A1 | 10/2012 |
| TW | 201316502 A1 | 4/2013 |

* cited by examiner

*Primary Examiner* — Su C Kim
*Assistant Examiner* — David S Wilbert
(74) *Attorney, Agent, or Firm* — Birch, Stewart, Kolasch & Birch, LLP (57) ABSTRACT

An image sensor structure and a method for forming the same are provided. The image sensor structure includes a first substrate including a first radiation sensing region and a first interconnect structure formed over a front side of the first substrate. The image sensor structure further includes a second substrate including a second radiation sensing region and a second interconnect structure formed over a front side of the second substrate. In addition, the first interconnect structure is bonded with the second interconnect structure.

20 Claims, 8 Drawing Sheets

IMAGE SENSOR AND METHOD FOR MANUFACTURING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of an integrated circuit (IC) structure and methods for forming the same are provided. In some embodiments, the IC structure includes an image sensor.

FIGS. 1A to 1G are cross-sectional representations of various stages of forming an image sensor 100a in accordance with some embodiments.

However, it should be noted that image sensor 100a illustrated in FIGS. 1A to 1G has been simplified for the sake of clarity so that concepts of the present disclosure can be better understood. Therefore, in some other embodiments, additional features are added in image sensor 100a, and some of the elements are replaced or eliminated. For example, image sensor 100a may include various passive and active microelectronic devices, such as resistors, capacitors, inductors, diodes, metal-oxide-semiconductor field effect transistors (MOSFET), complementary metal-oxide-semiconductor (CMOS) transistors, high-voltage transistors, high-frequency transistors, or other applicable components. In addition, it should be noted that different embodiments may have different advantages than those described herein, and no particular advantage is necessarily required of any embodiment.

Figure 1A:
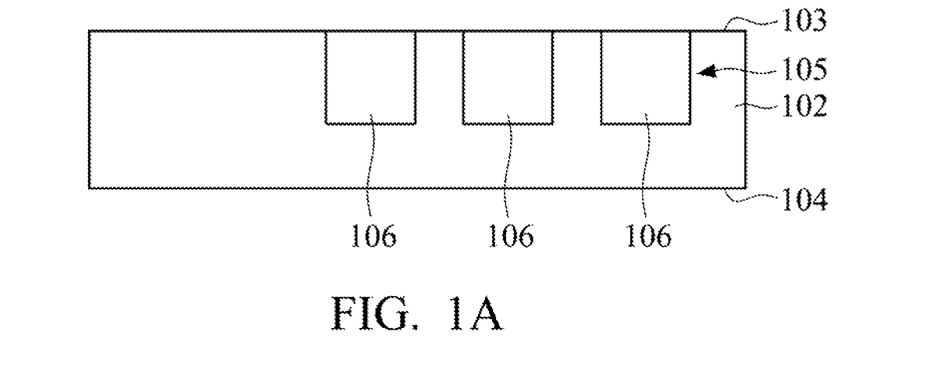
FIGS. 1A to 1G are cross-sectional representations of various stages of forming an image sensor in accordance with some embodiments.

A first substrate 102 is received, as shown in FIG. 1A in accordance with some embodiments. In some embodiments, first substrate 102 is a semiconductor substrate including silicon. Alternatively or additionally, first substrate 102 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. First substrate 102 may be a p-type or an n-type substrate depending on the design requirements of image sensor 100a. First substrate 102 may also include isolation features (not shown), such as shallow trench isolation (STI) and/or local oxidation of silicon (LOCOS) features, to separate the pixels (discussed below) and/or other devices formed on first substrate 102. In some embodiments, first substrate 102 is a device wafer. In some embodiments, first substrate 102 has a first thickness in a range from about 200 µm to about 400 µm. As shown in FIG. 1A, first substrate 102 has a front side 103 and a back side 104.

A first pixel array 105 is formed in front side 103 of first substrate 102 in accordance with some embodiments. The term "pixel" refers to a unit cell containing features (for example, circuitry including a photodetector and various semiconductor structures) for converting electromagnetic radiation into electrical signals. Therefore, first pixel array 105 may include various features and circuitry allowing it to detect the intensity of incident radiation.

In some embodiments, first pixel array 105 includes first radiation sensing regions 106 corresponding to a specific range of wavelength. In some embodiments, first radiation sensing regions 106 correspond to a range of wavelengths of near infrared. That is, first radiation sensing regions 106 may detect the intensity (brightness) of near infrared radiation. First radiation sensing regions 106 may be doped regions having n-type and/or p-type dopants formed in front side 103 of first substrate 102. First radiation sensing regions 106 may be formed by an ion implantation process, diffusion process, or other applicable processes.

In some embodiments, first radiation sensing region 106 has a thickness in a range from about 5 µm to about 30 µm. As described previously, first radiation sensing regions 106 may be configured to sense (detect) near infrared radiation, and therefore even if each first radiation sensing region 106 has a relatively large size, it can still achieve the desired resolution.

Figure 1B:
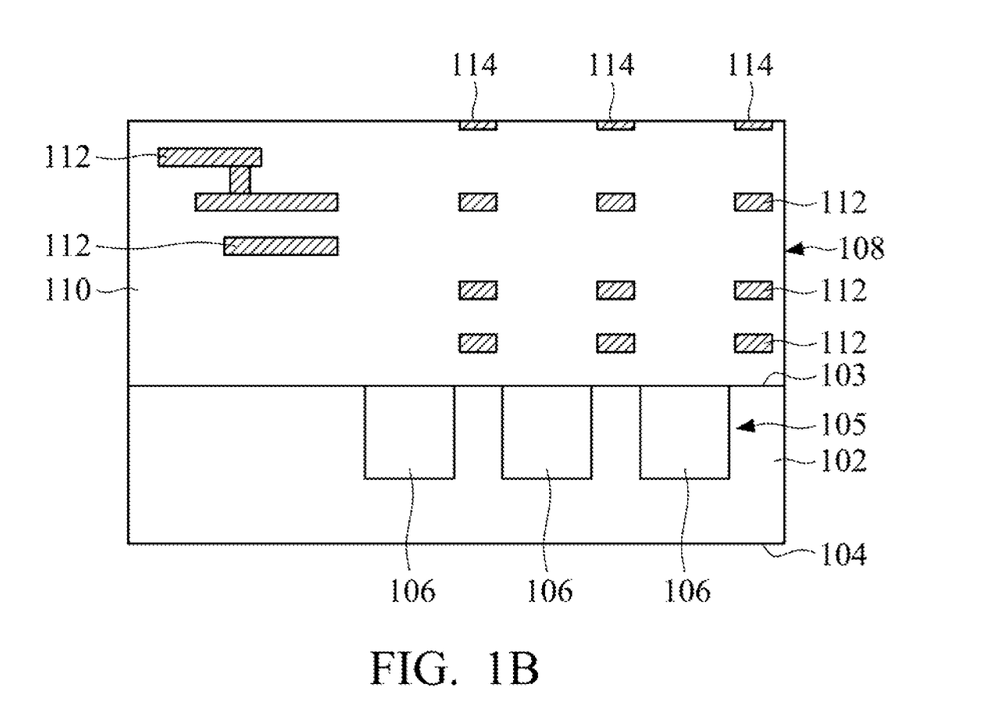

After first pixel array 105 is formed, a first interconnect structure 108 is formed over front side 103 of first substrate 102, as shown in FIG. 1B in accordance with some embodiments. In some embodiments, first interconnect structure 108 has a thickness in a range from about 1 µm to about 5 µm.

First interconnect structure 108 includes a first dielectric layer 110 and first conductive features 112 formed in first dielectric layer 110. First conductive features 112 are designed and arranged to enable radiation passing through first interconnect structure 108 to reach first radiation sensing regions 106 in first substrate 102 (The details will be described later).

In some embodiments, first dielectric layer 110 includes interlayer (or inter-level) dielectric (ILD) layers and/or inter-metal dielectric (IMD) layers. In some embodiments, first dielectric layer 110 includes multilayers made of multiple dielectric materials, such as silicon oxide, silicon nitride, silicon oxynitride, phosphosilicate glass (PSG), borophosphosilicate glass (BPSG), or other applicable low-k dielectric materials. First dielectric layer 110 may be formed by a chemical vapor deposition (CVD), physical vapor deposition, (PVD), atomic layer deposition (ALD), spin-on coating, or other applicable processes.

First conductive features 112 may be configured to connect various features or structures of image sensor 100a. For example, first conductive features 112 may be used to interconnect the various devices formed on first substrate 102. First conductive features 112 may be vertical interconnects, such as vias and contacts, and/or horizontal interconnects, such as conductive lines. In some embodiments, first conductive features 112 are made of conductive materials, such as aluminum, aluminum alloy, copper, copper alloy, titanium, titanium nitride, tungsten, polysilicon, or metal silicide.

It should be noted that conductive features 112 shown in FIG. 1B are merely examples for better understanding the concept of the disclosure, and the scope of disclosure is not intended to be limiting. That is, conductive features 112 may be arranged in various ways in various embodiments.

In some embodiments, first interconnect structure 108 further includes first conductive pads 114 formed in first dielectric layer 110 at a top surface of first interconnect structure 108. First conductive pads 114 may be made of conductive materials, such as aluminum, aluminum alloy, copper, copper alloy, titanium, titanium nitride, or the like. First conductive pads 114 may also be arranged in such a way that the incident radiation will not be blocked by first conductive pads 114 when passing through first interconnect structure 108.

Figure 1C:
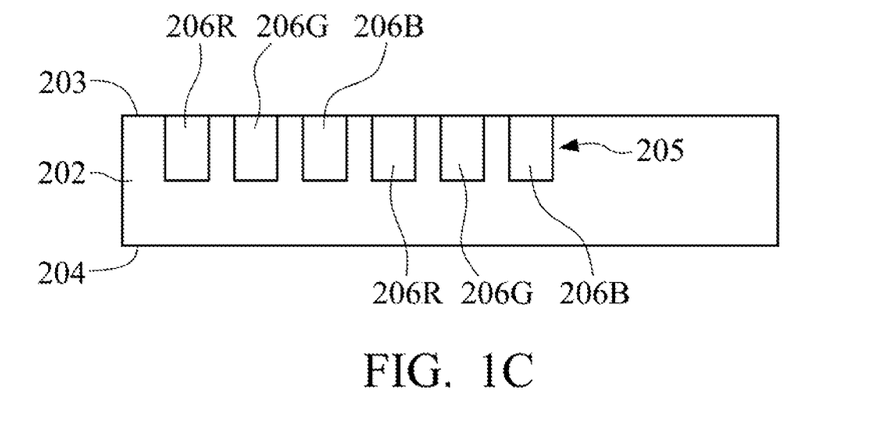

A second substrate 202 is received, as shown in FIG. 1C according to some embodiments. In some embodiments, second substrate 202 is a semiconductor substrate including silicon. Alternatively or additionally, second substrate 202 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. Second substrate 202 may be a p-type or an n-type substrate depending on the design requirements of image sensor 100a. Second substrate 202 may also include isolation features (not shown), such as shallow trench isolation (STI) and/or local oxidation of silicon (LOCOS) features, to separate the pixels (discussed below) and/or other devices formed on second substrate 202. In some embodiments, second substrate 202 is a device wafer. As shown in FIG. 1C, second substrate 202 has a front side 203 and a back side 204.

A second pixel array 205 is formed in front side 203 of second substrate 202 in accordance with some embodiments. Second pixel array 205 may include various features and circuitry allowing it to detect the intensity of incident radiation.

In some embodiments, second pixel array 205 includes second radiation sensing regions 206R, 206G, and 206B each corresponding to a specific range of wavelengths. In some embodiments, second radiation sensing regions 206R, 206G, and 206B and first radiation sensing regions 106 are configured to sense (detect) radiation of different wavelengths. In some embodiments, second radiation sensing regions 206R, 206G, and 206B respectively correspond to a range of wavelengths of red radiation, green radiation, and blue radiation. That is, second radiation sensing regions 206R, 206G, and 206B may detect the intensity (brightness) of a respective range of wavelengths of visible radiation. Second radiation sensing regions 206R, 206G, and 206B may be doped regions having n-type and/or p-type dopants formed in front side 203 of second substrate 202. As described previously, second light sensing regions 206R, 206G, and 206B are configured to detect visible radiation and first light sensing regions 106 are configured to detect near IR radiation. Therefore, the dopants in second light sensing regions 206R, 206G, and 206B and first light sensing regions 106 are different in accordance with some embodiments. Second radiation sensing regions 206R, 206G, and 206B may be formed by an ion implantation process, diffusion process, or other applicable processes.

In some embodiments, the second radiation sensing region (e.g. 206R, 206G, and 206B) has a thickness in a range from about 2 µm to about 3 µm. Since second light sensing regions 206R, 206G, and 206B are configured to detect visible radiation and first light sensing regions 106 are configured to detect near IR radiation, the thickness of each second radiation sensing region is smaller than the thickness of each first radiation sensing region 106 in accordance with some embodiments.

The widths of second radiation sensing regions 206R, 206G, and 206B may be substantially equal. In some embodiments, the second radiation sensing region (e.g. 206R, 206G, and 206B) has a second width in a range from about 2 µm to about 4 µm. As described previously, second radiation sensing regions 206R, 206G, and 206B may be configured to sense (detect) visible radiation, and therefore each second radiation sensing regions 206R, 206G, and 206B may have a relatively small size to achieve the desirable resolution. Accordingly, the second width of the second radiation sensing region (e.g. 206R, 206G, and 206B) is smaller than the first width of first radiation sensing region 106 in accordance with some embodiments. In some embodiments, a ratio of the width of one first radiation sensing region to the width of one second radiation sensing region is in a range from about 1:1 to about 4:1.

Figure 1D:
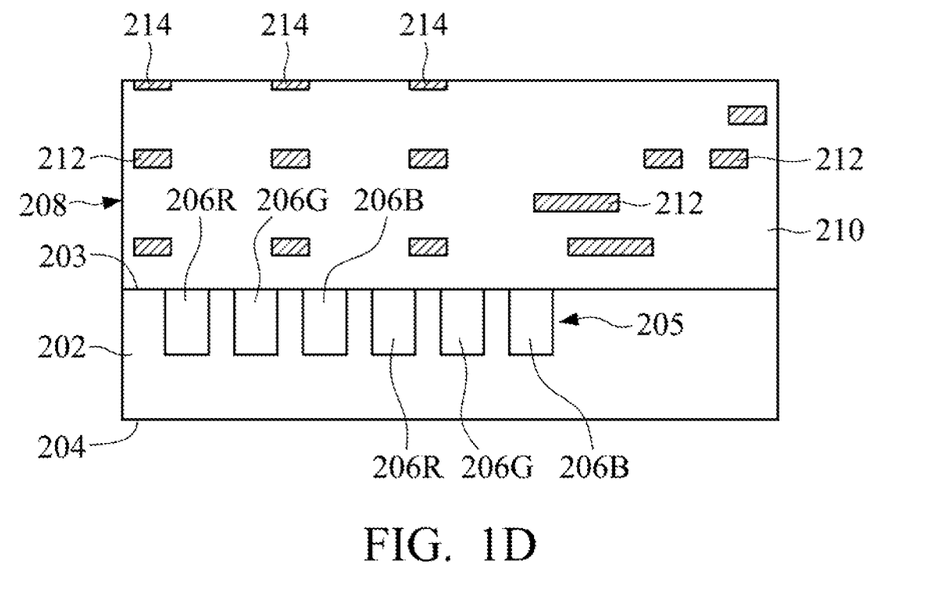

After second pixel array 205 is formed, a second interconnect structure 208 is formed over front side 203 of second substrate 202, as shown in FIG. 1D in accordance with some embodiments. Second interconnect structure 208 includes a second dielectric layer 210 and second conductive features 212 formed in second dielectric layer 210. Second conductive features 212 are designed and arranged to enable radiation entering from back side 204 of second substrate 202 passing through second interconnect structure 208 to reach first radiation sensing regions 106 in first substrate 102 (The details will be described later).

In some embodiments, second dielectric layer 210 includes interlayer (or inter-level) dielectric (ILD) layers and/or inter-metal dielectric (IMD) layers. In some embodiments, second dielectric layer 210 includes multilayers made of multiple dielectric materials, such as silicon oxide, silicon nitride, silicon oxynitride, phosphosilicate glass (PSG), borophosphosilicate glass (BPSG), or other applicable low-k dielectric materials. Second dielectric layer 210 may be formed by a chemical vapor deposition (CVD), physical vapor deposition, (PVD), atomic layer deposition (ALD), spin-on coating, or other applicable processes. In some embodiments, second interconnect structure 208 has a thickness in a range from about 1 µm to about 5 µm.

Second conductive features 212 may be configured to connect various features or structures of image sensor 100a. For example, second conductive features 212 are used to interconnect the various devices formed on second substrate 202. Second conductive features 212 may be vertical interconnects, such as vias and/or contacts, and/or horizontal interconnects, such as conductive lines. In some embodiments, second conductive features 212 are made of conductive materials, such as aluminum, aluminum alloy, copper, copper alloy, titanium, titanium nitride, tungsten, polysilicon, or metal silicide.

It should be noted that conductive features 112 shown in FIG. 1B are merely examples for better understanding the concept of the disclosure, and the scope of disclosure is not intended to be limiting. That is, second conductive features 212 may be arranged in various ways in various embodiments.

In some embodiments, second interconnect structure 208 further includes second conductive pads 214 formed in second dielectric layer 210 at a top surface of second interconnect structure 208. Second conductive pads 214 may be made of conductive materials, such as aluminum, aluminum alloy, copper, copper alloy, titanium, titanium nitride, or the like. Second conductive pads 214 may also be arranged in such a way that the incident radiation will not be blocked by second conductive pads 214 when passing through second interconnect structure 208.

Figure 1E:
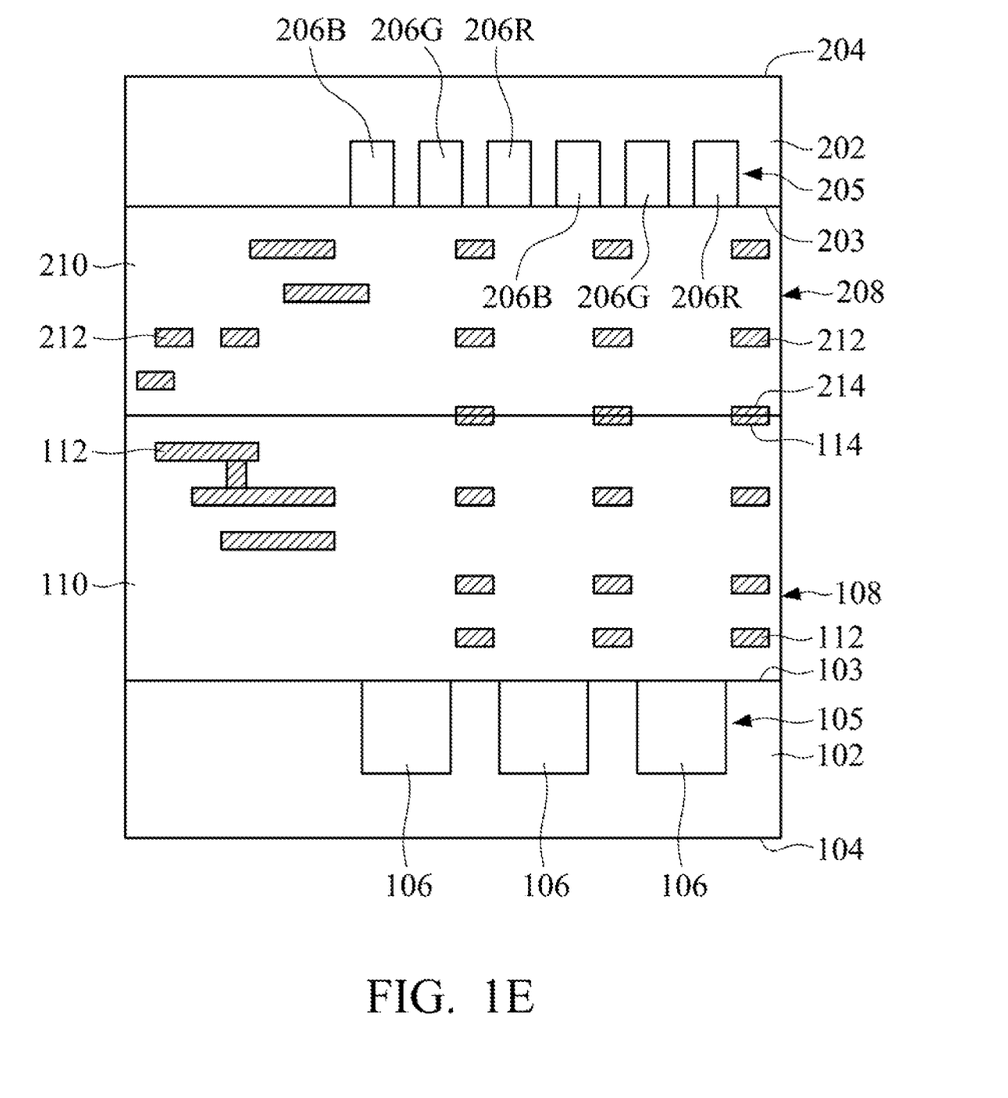

Next, second interconnect structure 208 is bonded to first interconnect structure 108, as shown in FIG. 1E in accordance with some embodiments. In some embodiments, first interconnect structure 108 and second interconnect structure 208 are bonded through hybrid bonding. In some embodiments, first conductive pads 114 and second conductive pads 214 are aligned before first interconnect structure 108 and second interconnect structure 208 are bonded, such that first conductive pads 114 can be bonded to second conductive pads 214 and first dielectric layer 110 can be bonded to second dielectric layer 210. In some embodiments, the alignment of first conductive pads 114 and second conductive pads 214 is achieved by using an optical sensing method.

After the alignment is performed, second interconnect structure 208 is disposed on first interconnect structure 108. In some embodiments, an annealing process is performed to bond first interconnect structure 108 and second interconnect structure 208. More specifically, a reflowing process is performed, such that first conductive pads 114 and second conductive pads 214 are reflowed to bond with each other. Similarly, first dielectric layer 110 and second dielectric layer 210 are also bonded to each other during the annealing process.

As shown in FIG. 1E, hybrid bonding involves at least two types of bonding, including metal-to-metal bonding and non-metal-to-non-metal bonding. More specifically, first conductive pads 114 and second conductive pads 214 are bonded by metal-to-metal bonding, and first dielectric layer 110 and second dielectric layer 210 are bonded by non-metal-to-non-metal bonding.

As described previously, first conductive features 112, first conductive pads 114, second conductive structures 212, and second conductive pads 214 are designed and arranged in such a way that the incident radiation will not be blocked by them, so that the incident radiation can pass through first interconnect structure 108 and second interconnect structure 208, as shown in FIG. 1E in accordance with some embodiments. In some embodiments, a sum of the thickness of the first interconnect structure 108 and the thickness of the second interconnect structure 208 is in a range from about 5 µm to about 20 µm.

As shown in FIG. 1E, after first interconnect structure 108 and second interconnect structure 208 are bonded, first pixel array 108 is overlapped with second pixel array 208, and first radiation sensing regions 106 is overlapped with second radiation sensing regions 206R, 206G, and 206B in accordance with some embodiments. In addition, first interconnect structure 108 and thinned second substrate 202' are at opposite sides of second interconnect structure 208, and second interconnect structure 208 and first substrate 102 are at opposite sides of first interconnect structure 108.

Figure 1F:
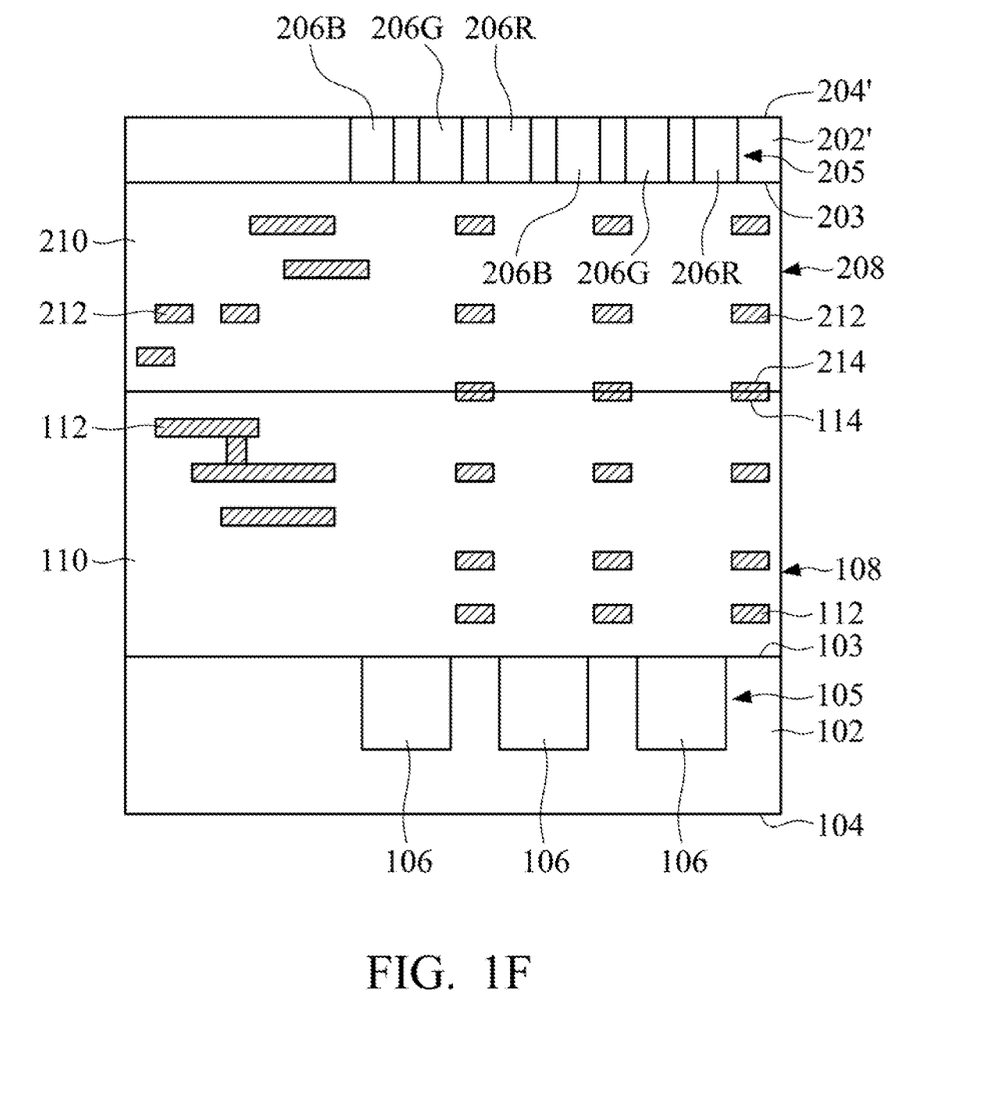

After first interconnect structure 108 is bonded with second interconnect structure 208, back side 204 of second substrate 202 is thin down to expose second radiation sensing regions 206R, 206G, 206B, as shown in FIG. 1F in accordance with some embodiments. Accordingly, a thinned second substrate 202' having a back side 204' is formed. As shown in FIG. 1F, second radiation sensing regions 206R, 206G, 206B are exposed from back side 204' of second substrate 202'. In some embodiments, second substrate 202 is polished by a chemical mechanical polishing (CMP) process.

In some embodiments, thinned second substrate 202' has a second thickness, which is smaller than the first thickness of first substrate 102. In some embodiments, the second thickness of thinned second substrate 202' is in a range from about 2 µm to about 3 µm.

Figure 1G:
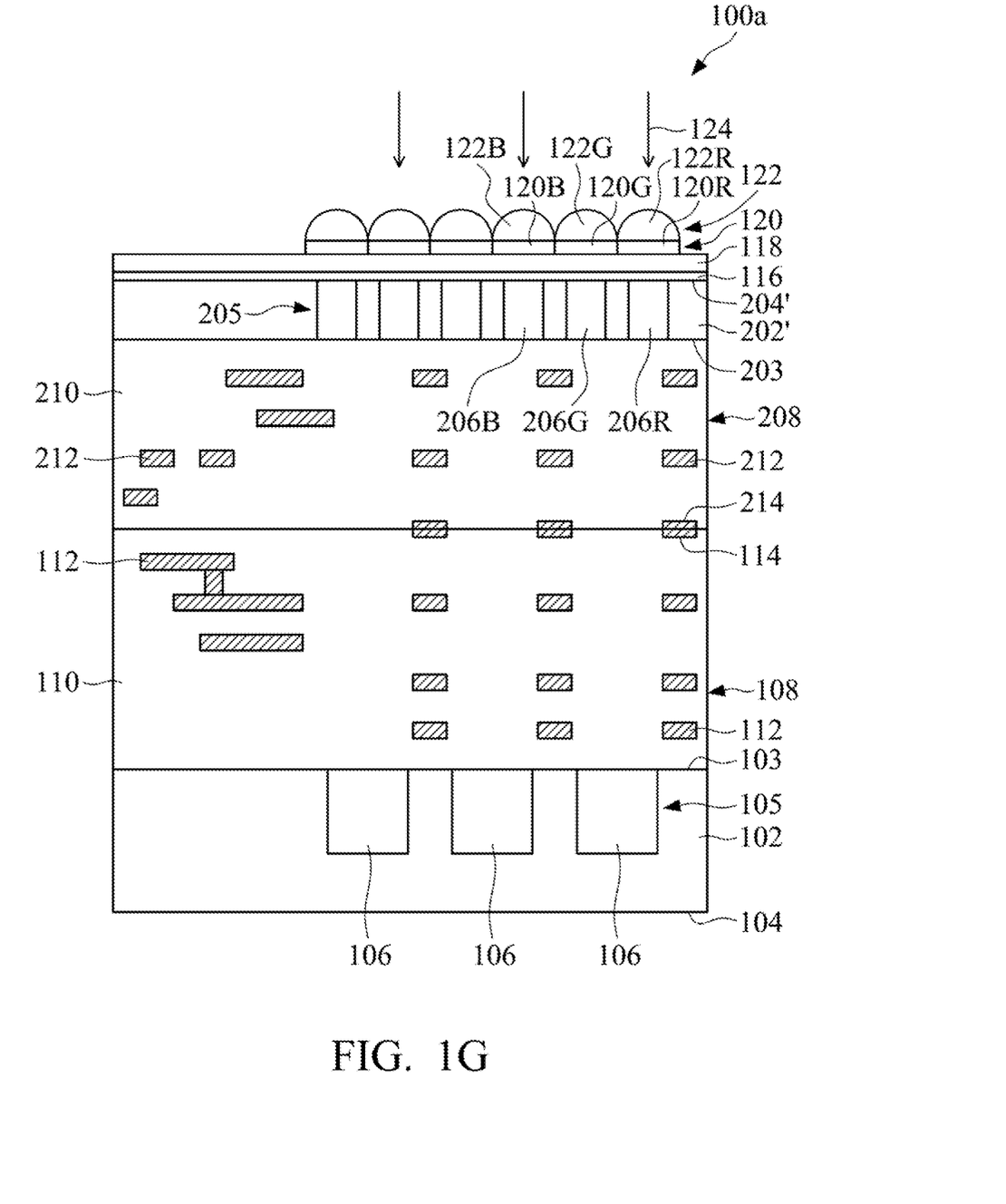

Next, antireflective layer 116 is formed over back side 104' of thinned second substrate 202' to cover exposed second radiation sensing regions 106R, 106G, and 106B, as shown in FIG. 1G in accordance with some embodiments. In some embodiments, antireflective layer 116 is made of silicon carbide nitride, silicon oxide, or the like.

After antireflective layer 116 is formed, a passivation layer 118 is formed over antireflective layer 116, as shown in FIG. 1G in accordance with some embodiments. In some embodiments, passivation layer 118 is made of silicon nitride or silicon oxynitride.

After passivation layer 112 is formed, color filter layer 120 is formed over passivation layer 118, and a microlens layer 122 is disposed over color filter layer 120, as shown in FIG. 1G in accordance with some embodiments. Color filter layer 120 may include more than one color filter. In some embodiments, color filter layer 120 includes color filters 120R, 120G, and 120B. In some embodiments, each of the color filters 120R, 120G, and 120B is aligned with its respective, corresponding second radiation sensing region 206R, 206G, and 206B. In addition, infrared radiation, such as near infrared radiation, is not filtered out by color filters 120R, 120G, and 120B.

In some embodiments, color filters 120R, 120G, and 120B are made of a dye-based (or pigment-based) polymer for filtering out a specific frequency band. In some embodiments, color filters 120R, 120G, and 120B are made of a resin or other organic-based material having color pigments.

In some embodiments, microlens layer 122 disposed on color filter layer 120 includes microlens 122R, 122G, and 122B. As shown in FIG. 1G, each of microlens 122R, 122G, and 122B is aligned with one of the corresponding color filters 120R, 120G, and 120B, and therefore is aligned with one of the corresponding second radiation sensing region 206R, 206G, and 206B. However, it should be noted that microlens 122R, 122G, and 122B may be arranged in various positions in various applications. In addition, microlens 122R, 122G, and 122B may have a variety of shapes and sizes, depending on the materials of microlenses 122R, 122G, and 122B and/or the distance between microlenses 122R, 122G, and 122B and second radiation sensing regions 206R, 206G, and 206B.

As shown in FIG. 1G, image sensor 100*a* may be similar to a combination of the structures of a back side illuminated (BSI) image sensor and a front side illuminated (FSI) image sensor. More specifically, second interconnect structure 208 is bonded to first interconnect structure 108 in such a way that front side 203 of thinned second substrate 202' is facing front side 103 of first substrate 102. In addition, color filter layer 120 and microlens layer 122 are formed over back side 204' of thinned second substrate 202'. That is, color filter layer 120 and microlens layer 122 are formed over front side 103 of first substrate 102. Furthermore, first radiation sensing regions 106 are configured to sense near infrared radiation, and second radiation sensing regions 206R, 206G, and 206B are configured to sense visible radiation (light).

In some embodiments, image sensor 100*a* is designed to receive incident radiation 124 (e.g. radiation) entering from back side 204' of thinned second substrate 202', as shown in FIG. 1G in accordance with some embodiments. First, microlens layer 122 directs incident radiation 124 to color filter layer 120.

Next, incident radiation 124 passes through color filter layer 120 to second radiation sensing regions 206R, 206G, and 206B in second pixel array 205. Second radiation sensing regions 206R, 206G, and 206B detect and analyze incident radiation 124 at visible wavelength. Afterwards, incident radiation 124 further passes through second interconnect structure 208 and first interconnect structure 108 to reach first radiation sensing regions 106 in first pixel array 105. First radiation sensing regions 106 detect and analyze incident radiation 124 at near infrared wavelength. It should be noted that no infrared filtering layer is formed so the near infrared will not be filtered out and can be detected by first radiation sensing regions 106 in first substrate 102. In some embodiments, the signals direct from first radiation sensing regions 106 and from second radiation sensing regions 206R, 206G, and 206B are combined and analyzed to avoid the miscalculated due to infrared radiation sensing by second radiation sensing regions 206R, 206G, and 206B.

It should be noted that the numbers of first radiation sensing regions 106 and second radiation sensing regions 206R, 206G, and 206B shown in FIGS. 1A to 1G are merely examples. For example, each first radiation sensing region may overlap with nine second radiation sensing regions. In some other example, each first radiation sensing region may overlap with six second radiation sensing regions.

Figure 2A:
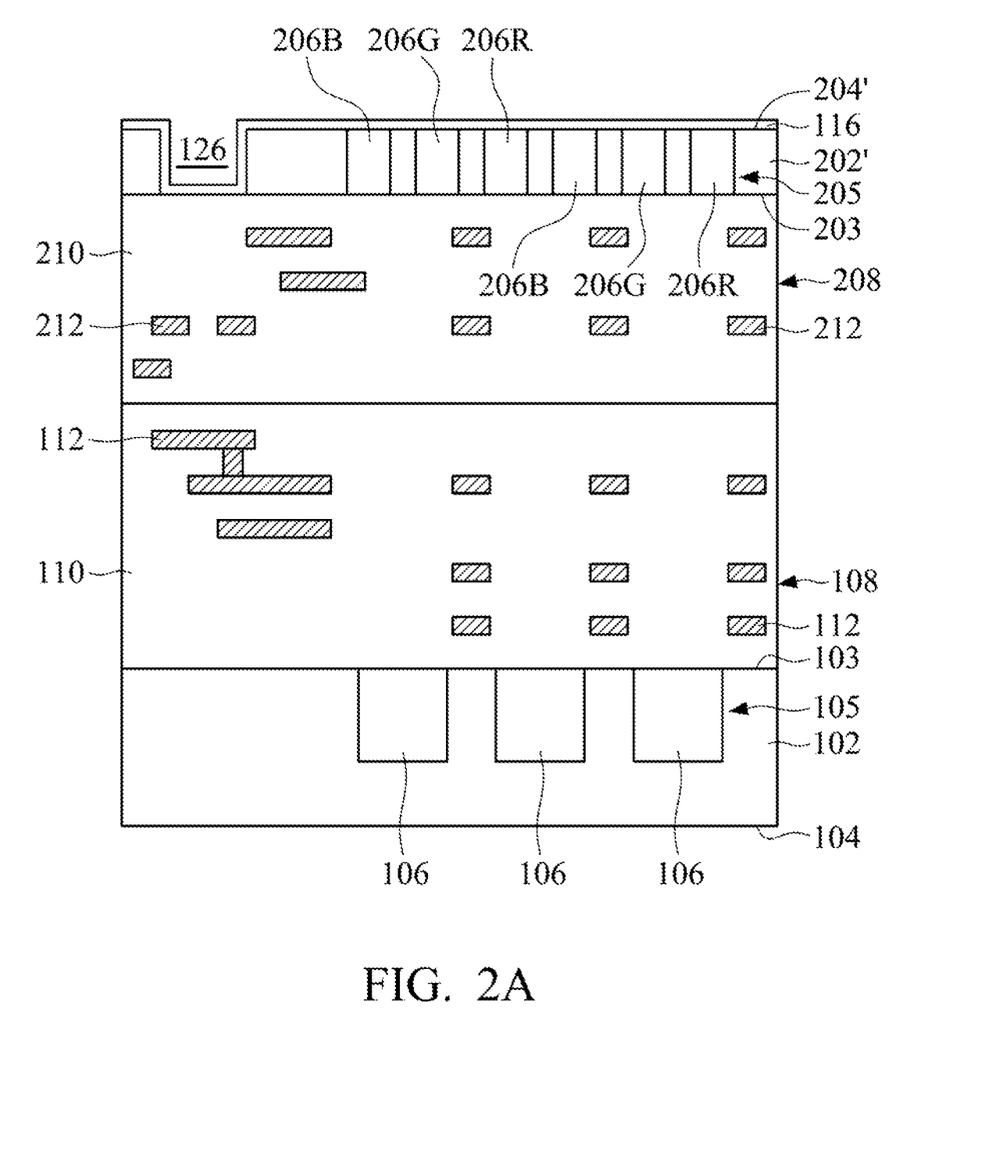
FIGS. 2A to 2C are cross-sectional representations of various stages of forming an image sensor in accordance with some embodiments.
Figure 2B:
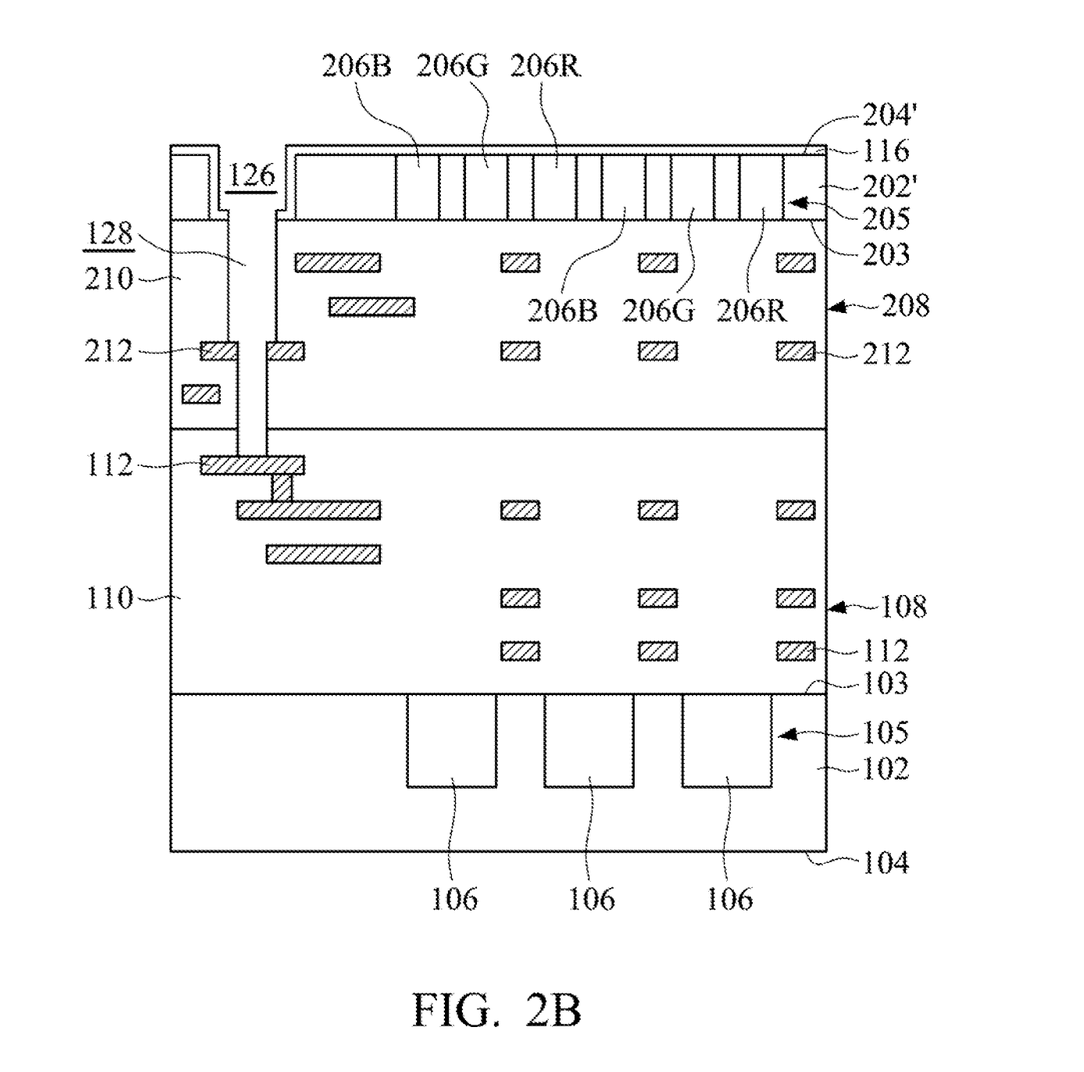
Figure 2C:
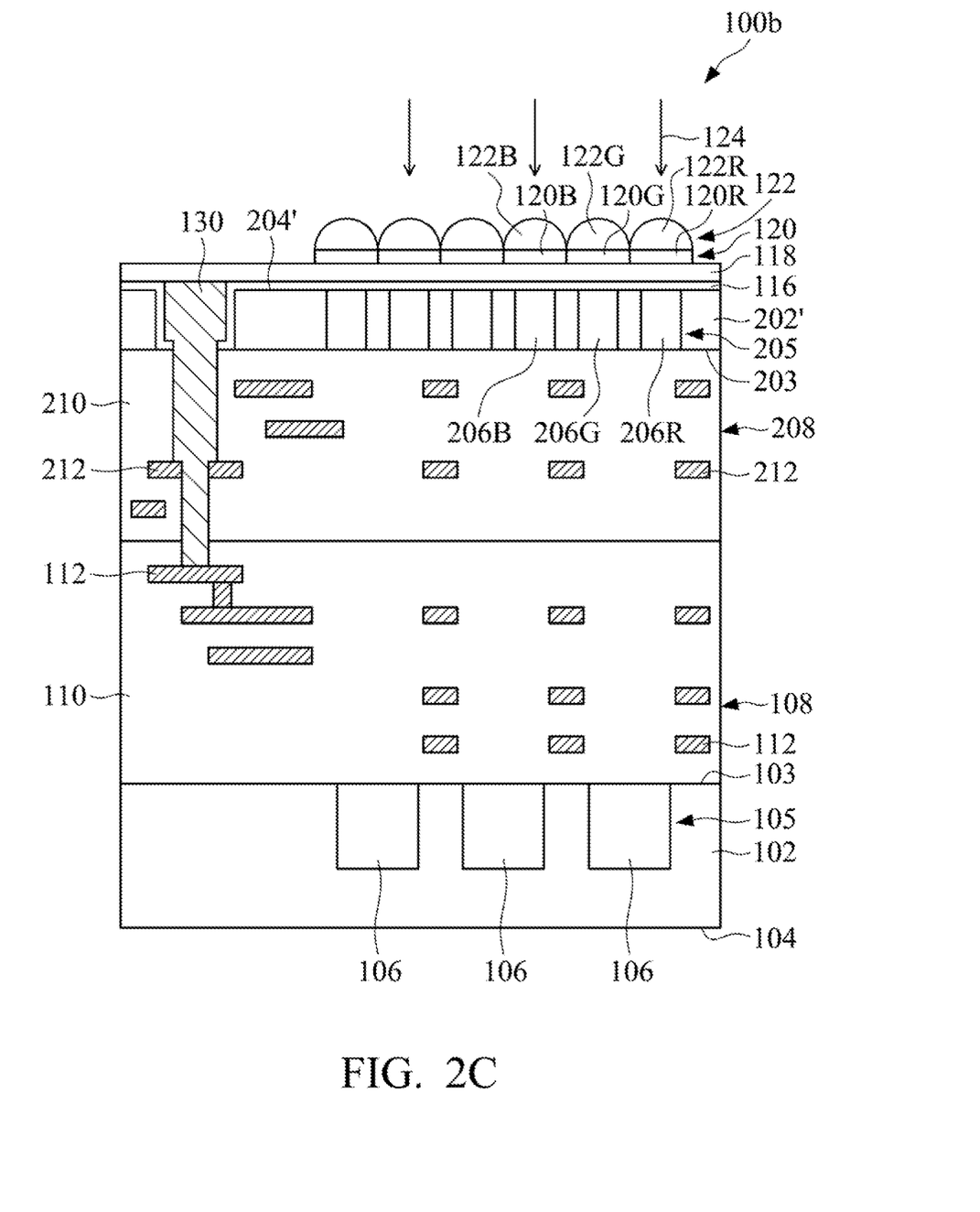

FIGS. 2A to 2C are cross-sectional representations of various stages of forming an image sensor 100*b* in accordance with some embodiments. Image sensor 100*b* is similar to image sensor 100*a*, except its first interconnect structure and second interconnect structure are connected through a through oxide via. Some materials and methods used to form image sensor 100*b* may be similar to those used to form image sensor 100*a* described previously and are not repeated herein.

Like those shown in FIGS. 1A to 1F, first pixel array 105 is formed in front side 103 of first substrate 102 in accordance with some embodiments. First pixel array 105 includes first radiation sensing regions 106 corresponding to a specific range of wavelength, such as a range of wavelengths of near infrared. After first pixel array 105 is formed, first interconnect structure 108 is formed over front side 103 of first substrate 102 in accordance with some embodiments. First interconnect structure 108 includes first dielectric layer 110 and first conductive features 112 formed in first dielectric layer 110. First conductive features 112 are arranged in such a way that radiation can pass through first interconnect structure 108 to reach first radiation sensing regions 106 without blocking by first conductive features 112.

Similarly, second pixel array 205 is formed in the front side of the second substrate, similar to second substrate 202, in accordance with some embodiments. Second pixel array 205 includes second radiation sensing regions 206R, 206G, and 206B each corresponding to a specific range of wavelengths. In some embodiments, second radiation sensing regions 206R, 206G, and 206B respectively correspond to a range of wavelengths of red radiation, green radiation, and blue radiation. After second pixel array 205 is formed, second interconnect structure 208 is formed over the front side of the second substrate in accordance with some embodiments. Second interconnect structure 208 includes a second dielectric layer 210 and second conductive features 212 formed in second dielectric layer 210.

Next, second interconnect structure 208 is bonded to first interconnect structure 108 in accordance with some embodiments. In some embodiments, first interconnect structure 108 and second interconnect structure 208 are bonded by heat pressing. In some embodiments, first interconnect structure 108 and second interconnect structure 208 are bonded by an adhesive layer.

After first interconnect structure 108 is bonded to second interconnect structure 208, the back side of the second substrate is thinned down to expose second radiation sensing regions 206R, 206G, 206B, as shown in FIG. 2A in accordance with some embodiments. Accordingly, thinned second substrate 202' having back side 204' and front side 203 is formed. As shown in FIG. 2A, second radiation sensing regions 206R, 206G, 206B are exposed from back side 204' of second substrate 202'.

Next, a trench 126 is formed in thinned second substrate 202', as shown in FIG. 2A in accordance with some embodiments. As shown in FIG. 2A, trench 126 is formed in a position not overlapping with second pixel array 205. After trench 126 is formed, antireflective layer 116 is conformally formed over back side 104' of thinned second substrate 202' to cover exposed second radiation sensing regions 106R, 106G, and 106B, as shown in FIG. 2A in accordance with some embodiments. In addition, antireflective layer 116 is also formed on the sidewalls and bottom surface of trench 126 and can be seen as an insulating layer for the through oxide via formed in subsequent processes.

After antireflective layer 116 is formed, a trench 128 is formed through second interconnect structure 208 and extends into a portion of first interconnect structure 108, as shown in FIG. 2B in accordance with some embodiments. Next, a though oxide via (TOV) 130 is formed in trench 126 and trench 128, as shown in FIG. 2C in accordance with some embodiments.

As shown in FIG. 2C, through oxide via 130 may be in direct contact with one or more second conductive features 212 and first conductive features 112, and therefore, first interconnect structure 108 and second interconnect structure 208 can be electrically connected.

Afterwards, passivation layer 118 is formed over antireflective layer 116, and color filter layer 120 and microlens layer 122 are formed, as shown in FIG. 2C in accordance with some embodiments. Color filter layer 120 includes color filters 120R, 120G, and 120B. In some embodiments, each of the color filters 120R, 120G, and 120B is aligned with its respective, corresponding second radiation sensing region 206R, 206G, and 206B. In some embodiments, microlens layer 122 disposed on color filter layer 120 includes microlens 122R, 122G, and 122B. As shown in FIG. 1G, each of microlens 122R, 122G, and 122B is aligned with one of the corresponding color filters 120R, 120G, and 120B, and therefore is aligned with one of the corresponding second radiation sensing region 206R, 206G, and 206B. Like image sensor 100a, image sensor 100b may be designed to receive incident radiation 124 entering from back side 204' of thinned second substrate 202', as shown in FIG. 2C in accordance with some embodiments. First, microlens layer 122 directs incident radiation 124 to color filter layer 120. Next, incident radiation 124 passes through color filter layer 114 to second radiation sensing regions 206R, 206G, and 206B. Second radiation sensing regions 206R, 206G, and 206B detect and analyze incident radiation 124 at visible wavelength. In addition, incident radiation 124 further passes through second interconnect structure 208 and first interconnect structure 108 to reach first radiation sensing regions 106. First radiation sensing regions 106 detect and analyze incident radiation 124 at near infrared wavelength.

As described previously, image sensors 100a and 100b may be similar to a combination of the structures of a back side illuminated (BSI) image sensor and a front side illuminated (FSI) image sensor. More specifically, first substrate 102 and second substrate 202 are bonded through first interconnect structure 108 and second interconnect structure 208. In addition, back side 204 of second substrate 202 is thinned down, and color filter layer 120 and microlens layer 122 are formed over back side 204' of thinned second substrate 202'.

Furthermore, first conductive features 112 and second conductive features 212 are arranged to enable incident radiation passing through first interconnect structure 106 and second interconnect structure 206. Accordingly, radiation can pass through microlens layer 122, color filter layer 120, second radiation sensing regions 206R, 206G, and 206B, second interconnect structure 208, and first interconnect structure 108 and reach first radiation sensing regions 106 in first substrate 102.

First radiation sensing regions 106 are formed in first substrate 102 to detect near infrared radiation, and second radiation sensing regions 206R, 206G, and 206B are formed in second substrate 202 to sense visible radiation. That is, the radiation sensing regions for sensing visible radiation and near infrared radiation are located at different substrates. Therefore, first radiation sensing regions 106 and second radiation sensing regions 206R, 206G, and 206B can be designed and formed separately without undermining the formation of each other.

In addition, if the radiation sensing regions for sensing visible radiation and near infrared radiation are formed in the same substrate, such as a substrate in a BSI image sensor, which may be similar to thinned second substrate 202', the quantum efficiency for detecting near infrared radiation may be poor since the detection of near infrared radiation requires a greater substrate thickness. Furthermore, the sensing regions for detecting near infrared radiation need to be relatively large, and the sensing regions for detecting visible radiation may also have a relatively large size if they are formed in the same substrate. However, if the sensing regions for detecting visible radiation are too large, its resolution may be too low.

Accordingly, in some embodiments, first radiation sensing regions 106 and second radiation sensing regions 206R, 206G, and 206B are respectively formed on first substrate 102 and second substrate 202. In addition, the size of one first radiation sensing regions 106 is greater than the size of one second radiation sensing region 206R, 206G, or 206B. Therefore, the resolution of image sensors 100a and 100b may be improved.

Furthermore, since first radiation sensing regions 106 and second radiation sensing regions 206R, 206G, and 206B are formed in different substrates, the thicknesses of first radiation sensing regions 106 and second radiation sensing regions 206R, 206G, and 206B can also be adjusted as required. For example, the thickness of one first radiation sensing region 106 is thicker than the thickness of one second radiation sensing region 206R, 206G, or 206B. Accordingly, the quantum efficiency may be improved. Since the quantum efficiency is improved, the signal-to-noise ratio may also be improved, and lower power may be required.

In addition, although first radiation sensing regions 106 and second radiation sensing regions 206R, 206G, and 206B are formed on different substrates, they are combined as a single structure. That is, first radiation sensing regions 106 configured to detect near infrared radiation and second radiation sensing regions 206R, 206G, and 206B configured to detect visible radiation are formed in the same package. Therefore, compared to forming radiation sensing regions for detecting near infrared and visible radiation separately in two separated packages, image sensors 100a and 100b described previously can be smaller and their formation less complicated. Therefore, the cost of manufacturing image sensors 100a and 100b is reduced.

Embodiments of image sensor structures and methods for manufacturing the same are provided. The image sensor structure includes a first radiation sensing region formed in a first substrate and a second radiation sensing region formed in a second substrate. A first interconnect structure is formed over the first substrate, and a second interconnect structure formed in the second structure. The first interconnect structure is bonded to the second interconnect structure. In addition, incident radiation enter the image sensor from the second substrate and reach the first radiation sensing region and the second radiation sensing region. The first radiation sensing region and the second radiation sensing region are configured to sense radiation of different wavelengths. Since they are not formed in the same substrate, their sizes and thicknesses may be adjusted separately, and therefore the resolution of the image sensor can be improved.

In some embodiments, an image sensor structure is provided. The image sensor structure includes a first substrate including a first radiation sensing region and a first interconnect structure formed over a front side of the first substrate. The image sensor structure further includes a second substrate including a second radiation sensing region and a second interconnect structure formed over a front side of the second substrate. In addition, the first interconnect structure is bonded with the second interconnect structure.

In some embodiments, an image sensor structure is provided. The image sensor structure includes a first substrate including a first radiation sensing region at a front side of the first substrate and a first interconnect structure is formed over the front side of the first substrate. The image sensor structure further includes a second substrate including a second radiation sensing region at a front side of the second substrate and a second interconnect structure formed over the front side of the second substrate. The image sensor structure further includes a color filter layer formed over a back side of the second substrate. In addition, the first interconnect structure is bonded to the second interconnect structure.

In some embodiments, a method for manufacturing an image sensor structure is provided. The method for manufacturing the image sensor structure includes forming a first radiation sensing region in a front side of a first substrate and forming a first interconnect structure over the front side of the first substrate. The method for manufacturing the image sensor structure further includes forming a second radiation sensing region in a front side of a second substrate and forming a second interconnect structure over the front side of the second substrate. The method for manufacturing the image sensor structure further includes bonding the first interconnect structure to the second interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor structure, comprising:
    a first substrate comprising a plurality of first radiation sensing regions;
    a first interconnect structure formed over a front side of the first substrate;
    a second substrate comprising a plurality of second radiation sensing regions; and
    a second interconnect structure formed over a front side of the second substrate,
    wherein the first interconnect structure is bonded with the second interconnect structure, the first interconnect structure comprises a first conductive feature, the second interconnect structure comprises second conductive features, and the first conductive feature and the second conductive features are located directly above a space between two of the plurality of first radiation sensing regions and below a space between two of the plurality of second radiation sensing regions, and the first conductive feature overlaps with the two of the plurality of second radiation sensing regions without overlapping with the two of the plurality of first radiation sensing regions.

2. The image sensor structure as claimed in claim 1, further comprising:
    a color filter layer formed over a back side of the second substrate.

3. The image sensor structure as claimed in claim 1, wherein the second conductive features are designed to enable radiation entering from the second substrate to pass through the second interconnect structure.

4. The image sensor structure as claimed in claim 1, wherein the first radiation sensing region has a first width, and the second radiation sensing region has a second width which is smaller than the first width.

5. The image sensor structure as claimed in claim 1, wherein the first substrate has a first thickness, and the second substrate has a second thickness which is smaller than the first thickness.

6. The image sensor structure as claimed in claim 1, wherein the first radiation sensing region is configured to sense near infrared radiation, and the second radiation sensing region is configured to sense visible radiation.

7. An image sensor structure, comprising:
    a first substrate comprising a first radiation sensing region at a front side of the first substrate;
    a first interconnect structure comprising a first conductive feature formed over the front side of the first substrate and a first conductive pad;
    a second substrate comprising a second radiation sensing region and a third radiation sensing region at a front side of the second substrate, wherein the second radiation sensing region in the second substrate partially overlaps with the first radiation sensing region in the first substrate;
    a second interconnect structure comprising second conductive features formed over the front side of the second substrate and a second conductive pad; and
    a color filter layer formed over a back side of the second substrate,
    wherein the first interconnect structure is bonded to the second interconnect structure, and the first conductive feature, the first conductive pad and the second conductive pad are located directly under a space between the second radiation sensing region and the third radiation sensing region and overlaps with both the second radiation sensing region and the third radiation sensing region.

8. The image sensor structure as claimed in claim 7, wherein the second conductive features are arranged to enable radiation incident from the back side of the second substrate to pass through the second conductive features.

9. The image sensor structure as claimed in claim 7, wherein the first radiation sensing region is configured to sense near infrared radiation, and the second radiation sensing region is configured to sense visible radiation.

10. The image sensor structure as claimed in claim 7, wherein the first radiation sensing region is configure to sense radiation entering from the back side of the second substrate.

11. A method for manufacturing an image sensor structure, comprising:
    forming a first radiation sensing region in a front side of a first substrate;
    forming a first interconnect structure comprising first conductive features over the front side of the first substrate;
    forming a plurality of second radiation sensing regions in a front side of a second substrate;
    forming a second interconnect structure comprising second conductive features over the front side of the second substrate; and
    bonding the first interconnect structure to the second interconnect structure by directly bonding a first conductive pad in the first interconnect structure with a second conductive pad in the second interconnect structure so that the first radiation sensing region overlaps with at least one of the plurality of second radiation sensing regions, wherein the first conductive feature, the second conductive features, the first conductive pad and the second conductive pad are located directly under a space between two of the plurality of the second radiation sensing regions and overlap with the two of the plurality of the second radiation sensing regions.

12. The method for manufacturing an image sensor structure as claimed in claim 11, further comprising:
polishing a back side of the second substrate to expose the second radiation sensing region from the back side of the second substrate after the first interconnect structure and the second interconnect structure are bonded.

13. The method for manufacturing an image sensor structure as claimed in claim 11, further comprising:
forming a color filter layer over a back side of the second substrate.

14. The method for manufacturing an image sensor structure as claimed in claim 13, wherein the first radiation sensing region in the first substrate overlaps the second radiation sensing region in the second substrate.

15. The method for manufacturing an image sensor structure as claimed in claim 11, wherein the first conductive pad and the second conductive pad are reflowed to bond with each other.

16. The method for manufacturing an image sensor structure as claimed in claim 11, wherein the first radiation sensing region is configured to sense near infrared radiation, and the second radiation sensing region is configured to sense visible radiation.

17. The image sensor structure as claimed in claim 7, wherein the first conductive features are arranged to enable radiation incident from the back side of the second substrate to pass through the first conductive features.

18. The image sensor structure as claimed in claim 8, wherein the first conductive features are arranged to enable radiation incident from the back side of the second substrate to sequentially pass through the color filter layer, the second radiation sensing region, the second conductive features, and the first conductive features to reach the first radiation sensing region.

19. The method for manufacturing an image sensor structure as claimed in claim 11, further comprising:
aligning the first conductive structure with the second conductive structure before bonding the first interconnect structure to the second interconnect structure.

20. The image sensor structure as claimed in claim 7, wherein the first conductive pad is in direct contact with the second conductive pad.

* * * * *